(12) United States Patent
Hashimoto et al.

(10) Patent No.: US 8,298,363 B2
(45) Date of Patent: Oct. 30, 2012

(54) METHOD OF MANUFACTURING SOLAR CELL MODULE

(75) Inventors: Haruhisa Hashimoto, Mioh (JP);
Yukihiro Yoshimine, Kobe (JP);
Yasufumi Tsunomura, Kobe (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 447 days.

(21) Appl. No.: 12/668,608

(22) PCT Filed: Jun. 25, 2008

(86) PCT No.: PCT/JP2008/061539
§ 371 (c)(1),
(2), (4) Date: Feb. 26, 2010

(87) PCT Pub. No.: WO2009/011209
PCT Pub. Date: Jan. 22, 2009

(65) Prior Publication Data
US 2010/0181011 A1 Jul. 22, 2010

(30) Foreign Application Priority Data
Jul. 13, 2007 (JP) .................. 2007-184962

(51) Int. Cl.
*B32B 37/00* (2006.01)
(52) U.S. Cl. .................. 156/307.7; 156/166; 156/307.1; 156/307.3; 136/244; 136/252
(58) Field of Classification Search .................. 156/166, 156/297, 307.1, 307.3; 136/252, 244; 438/19
See application file for complete search history.

(56) References Cited

U.S. PATENT DOCUMENTS
7,998,760 B2 * 8/2011 Tabe ............................... 438/15

FOREIGN PATENT DOCUMENTS
| JP | 01-212480 A | 8/1989 |
| JP | 03-006867 A | 1/1991 |
| JP | 08-046226 A | 2/1996 |
| JP | 2000-022188 A | 1/2000 |
| JP | 2001-357897 A | 12/2001 |

(Continued)

*Primary Examiner* — Jeff Aftergut
(74) *Attorney, Agent, or Firm* — Marvin A. Motsenbocker; Mots Law, PLLC

(57) ABSTRACT

A manufacturing method of a solar module according the embodiment includes a step A of disposing one of the wiring members 11 on the light receiving surface of one solar cell of n solar cells, with a thermosetting resin adhesive 12 interposed therebetween, the wiring member being to be connected to a solar cell adjacently located on one side of the one solar cell, and disposing another one of the wiring members 11 on the back surface of the one solar cell with the resin adhesive 12 interposed therebetween, the wiring member 11 being to be connected to a solar cell 10 adjacently located on the other side of the one solar cell; a step B of bonding the wiring members 11 to the one solar cell by heating the resin adhesive 12 at a temperature higher than a softening temperature of the resin adhesive 12 but lower than a hardening temperature of the resin adhesive 12; a step C of bonding the wiring members 11 to all the n solar cells by repeating the step A and the step B alternately; and a step D of hardening the resin adhesive 12 by heating the resin adhesive 12 at a temperature equal to or higher than the hardening temperature of the resin adhesive 12 with the resin adhesive 12 being pressed against the wiring members 11.

5 Claims, 14 Drawing Sheets

FOREIGN PATENT DOCUMENTS

| | | |
|---|---|---|
| JP | 2003-086822 A | 3/2003 |
| JP | 2003-133570 A | 5/2003 |
| JP | 2004-247402 A | 9/2004 |
| JP | 2005-101519 A | 4/2005 |
| JP | 2005-243935 A * | 9/2005 |
| JP | 2005-243935 A | 9/2005 |

* cited by examiner

METHOD OF MANUFACTURING SOLAR CELL MODULE

TECHNICAL FIELD

The present invention relates to a method of manufacturing a solar cell module including a solar cell string formed by connecting multiple solar cells to wiring members with resin adhesive therebetween.

BACKGROUND ART

A solar cell is drawing attention as a new source of energy for its capability to directly convert solar light, which is clean and inexhaustibly supplied, into electricity.

Generally, the output of a single solar cell is about several watts. For this reason, when such a solar cell is used as a power source for a house, a building, or the like, a solar cell module in which multiple solar cells are electrically connected to each other to increase the output is used.

A solar cell module includes a solar cell string formed by electrically connecting together n solar cells arrayed in an array direction, by wiring members. The wiring members are each formed by coating a low resistance body, such as copper, with solder.

The solar cell string is formed by repeating the following step for each of the n solar cells. Specifically, the step includes: soldering wiring members to a light receiving surface of one solar cell, the wiring members being to be connected also to a back surface of a solar cell which is adjacently located on one side of the one solar cell; and soldering wiring members to a back surface of the one solar cell, the wiring members being connected also to a light receiving surface of a solar cell which is adjacently located on the other side of the one solar cell (see Japanese Patent Application Publication No. 2000-22188, for example).

DISCLOSURE OF THE INVENTION

Here, since the linear expansion coefficient of each wiring member is larger than the linear expansion coefficient of a semiconductor substrate used in each solar cell, the wiring member soldered to the solar cell tries to contract when cooled down to room temperature. As a result, a stress is developed inside the solar cell, which in turn causes warpage of the solar cell.

To solve this, it is conceivable that resin adhesive, which hardens at a lower temperature than the melting temperature of solder, may be used to bond the wiring member to the solar cell so that the wiring member would contract to a lesser extent when cooled down to room temperature.

However, in general, complete hardening of resin adhesive requires a longer time than a time needed for the soldering. Thus, the solar cell module manufacturing time would increase if a solar cell string were to be manufactured by the above-described solar cell string manufacturing method using resin adhesive.

The present invention has been made in view of the above problem and aims at providing a solar cell module manufacturing method enabling a shorter manufacturing time.

A method of manufacturing a solar cell module according to a first aspect of the present invention is summarized as a method of manufacturing a solar cell module including a solar cell string between a light-receiving-surface-side protection material and a back-surface-side protection material, the solar cell string being formed of a plurality of solar cells and wiring members electrically connecting the plurality of solar cells to one another, the plurality of solar cells each having a light receiving surface from which light enters, and a back surface provided on a side opposite to the light receiving surface, the method comprising: a step A of disposing one of the wiring members on the light receiving surface of one solar cell of the plurality of solar cells, with a thermosetting resin adhesive interposed therebetween, the wiring member being to be connected to a solar cell adjacently located on one side of the one solar cell, and of disposing another one of the wiring members on the back surface of the one solar cell with the resin adhesive interposed therebetween, the wiring member being to be connected to a solar cell adjacently located on the other side of the one solar cell; a step B of bonding the wiring members to the one solar cell by heating the resin adhesive at a temperature or higher than a softening temperature of the resin adhesive but lower than a hardening temperature of the resin adhesive; a step C of bonding the wiring members to all the plurality of solar cells by repeating the step A and the step B alternately; and a step D of hardening the resin adhesive by heating the resin adhesive at a temperature equal to or higher than the hardening temperature of the resin adhesive with the resin adhesive being pressed against the wiring members.

With the solar cell string manufacturing method according to the first characteristic of the present invention, a solar cell string can be manufactured in a shorter time than a case where main bonding of a wiring member to a solar cell with resin adhesive is repeated multiple times.

In the first aspect of the present invention, in the step A, the resin adhesive is preferably applied onto a part of the wiring member, the part being to be disposed on the back surface of the one solar cell, and onto the light receiving surface of the one solar cell.

In the first aspect of the present invention, in the step A, the resin adhesive is preferably applied onto a part of the wiring member, the part being to be disposed on the back surface of the one solar cell, and onto a part of the wiring member, the part being to be disposed on the light receiving surface of the one solar cell.

In the first aspect of the present invention, in the step A, the resin adhesive is preferably applied onto the back surface of the one solar cell and onto a part of the wiring member, the part being to be disposed on the light receiving surface of the one solar cell.

In the first aspect of the present invention, it is preferable that a plurality of thin wire electrodes be formed on the light receiving surface and the back surface of each of the plurality of solar cells, and that, in the step D, a part of each of the thin wire electrodes be buried in the corresponding wiring member by pressing the wiring member against the resin adhesive.

BEST MODES FOR CARRYING OUT THE INVENTION

Figure 1:
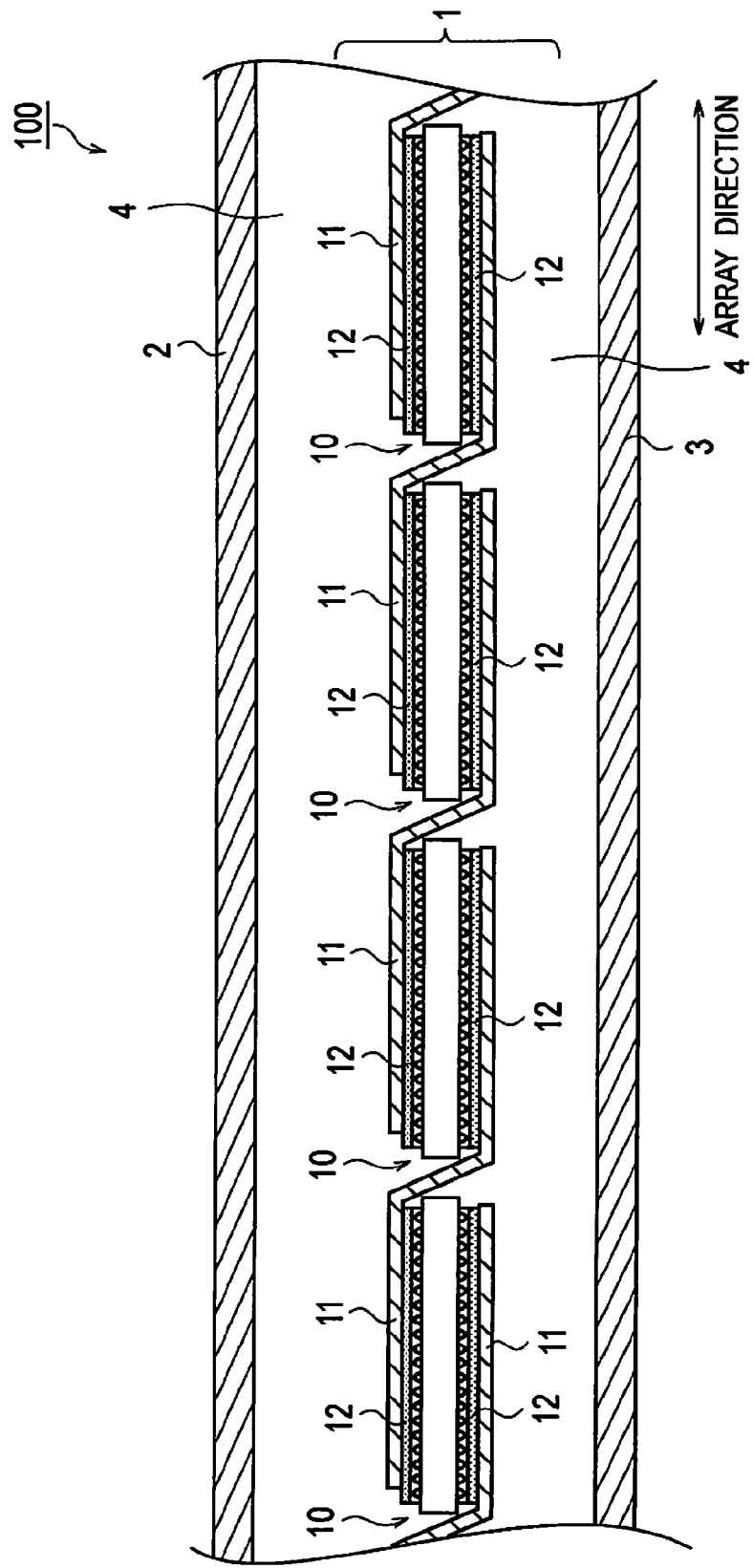
FIG. 1 is a side view of a solar cell module 100 according to an embodiment of the present invention.

Next, embodiments of the present invention will be described by using the drawings. Throughout the drawings, identical or similar constituents are denoted by identical or similar reference numerals. However, it is to be noted that the drawings are merely schematic and dimensional proportions, for example, are different from actuality. Therefore, concrete dimensions, for example, should be determined in consideration of the following description. Moreover, dimensional relations and proportions may naturally be different among the drawings in some parts.

1. First Embodiment (Configuration of Solar Cell Module)

A schematic configuration of a solar cell module 100 according to a first embodiment will be described with reference to FIG. 1. FIG. 1 is a side view of the solar cell module 100 according to the first embodiment.

The solar cell module 100 includes a solar cell string 1, a light-receiving-surface-side protection member 2, a back-surface-side protection member 3, and a sealing material 4.

The solar cell string 1 is sealed between the light-receiving-surface-side protection member 2 and the back-surface-side protection member 3 with the sealing material 4. The configuration of the solar cell string 1 will be described later in detail.

The light-receiving-surface-side protection member 2 is disposed on a light receiving surface side of the solar cell string 1, and protects the front surface of the solar cell module 100. For the light-receiving-surface-side protection member 2, a translucent and water-shielding glass, a translucent plastic, or the like having translucency and water-shielding property can be used.

The back-surface-side protection member 3 is disposed on a back surface side of the solar cell string 1, and protects the back surface of the solar cell module 100. For the back-surface-side protection member 3, a resin film made of PET (polyethylene terephthalate) or the like, a stacked film having such a structure that an Al foil is sandwiched by resin films, or the like can be used.

The sealing material 4 seals the solar cell string 1 between the light-receiving-surface-side protection member 2 and the back-surface-side protection member 3. For the sealing material 4, a translucent resin such as EVA, EEA, PVB, silicone, urethane, acrylic, epoxy, or the like can be used.

An Al frame (unillustrated) can be attached to the outer periphery of the solar cell module 100 having the above-described configuration.

(Configuration of Solar Cell String)

A configuration of the solar cell string 1 according to the first embodiment will be described with reference to FIG. 1. FIG. 1 is a side view of the solar cell string 1.

The solar cell string 1 includes multiple solar cells 10, wiring members 11, and resin adhesive 12. The multiple solar cells 10 arrayed in an array direction are connected to each other by the wiring members 11 to thereby form the solar cell string 1.

Each solar cell 10 has a light receiving surface from which solar light enters, and a back surface which is provided on a side opposite to the light receiving surface. The light receiving surface and the back surface of the solar cell 10 are the main surfaces of the solar cell 10. Collecting electrodes are formed on the light receiving surface and the back surface of the solar cell 10. The configuration of the solar cell 10 will be described later in detail.

The wiring members 11 are bonded to the collecting electrodes formed on the light receiving surface of one solar cell 10, and also to the collecting electrodes formed on the back surface of a different solar cell 10 adjacent to the one solar cell. This electrically connects the one solar cell 10 and the different solar cell 10 together. For each wiring member 11, a conductive material shaped like a thin plate or a twisted wire and made of copper or the like may be used. The wiring member 11 may be a thin copper plate or the like whose surface is plated with a soft conductive material (such as eutectic solder).

The resin adhesive 12 is disposed between the wiring members 11 and the solar cells 10. In other words, the wiring members 11 are bonded to the solar cells 11 with the resin adhesive 12 therebetween. The resin adhesive 12 is preferably an adhesive which hardens at the melting point of eutectic solder or lower, i.e., at a temperature of approximately 200° C. or lower. In addition to an acrylic resin or a highly-soft thermosetting resin adhesive made of polyurethane or the like, a two-component reactive adhesive obtained by mixing a hardening agent with epoxy resin, acrylic resin, or urethane resin, or the like can be used for the resin adhesive 12.

A strip-shaped film adhesive made mainly of epoxy resin is used for the resin adhesive 12 of this embodiment. Such resin adhesive 12 completely hardens when a hardening agent is added thereto and heated at 180° C. for a dozen or so seconds. In addition, the resin adhesive 12 contains conductive particles. For the conductive particles, nickel particles, gold-coated nickel particles, or particles obtained by coating a plastic with a conductive metal (such as gold) may be used.

(Configuration of Solar Cell)

Figure 2:
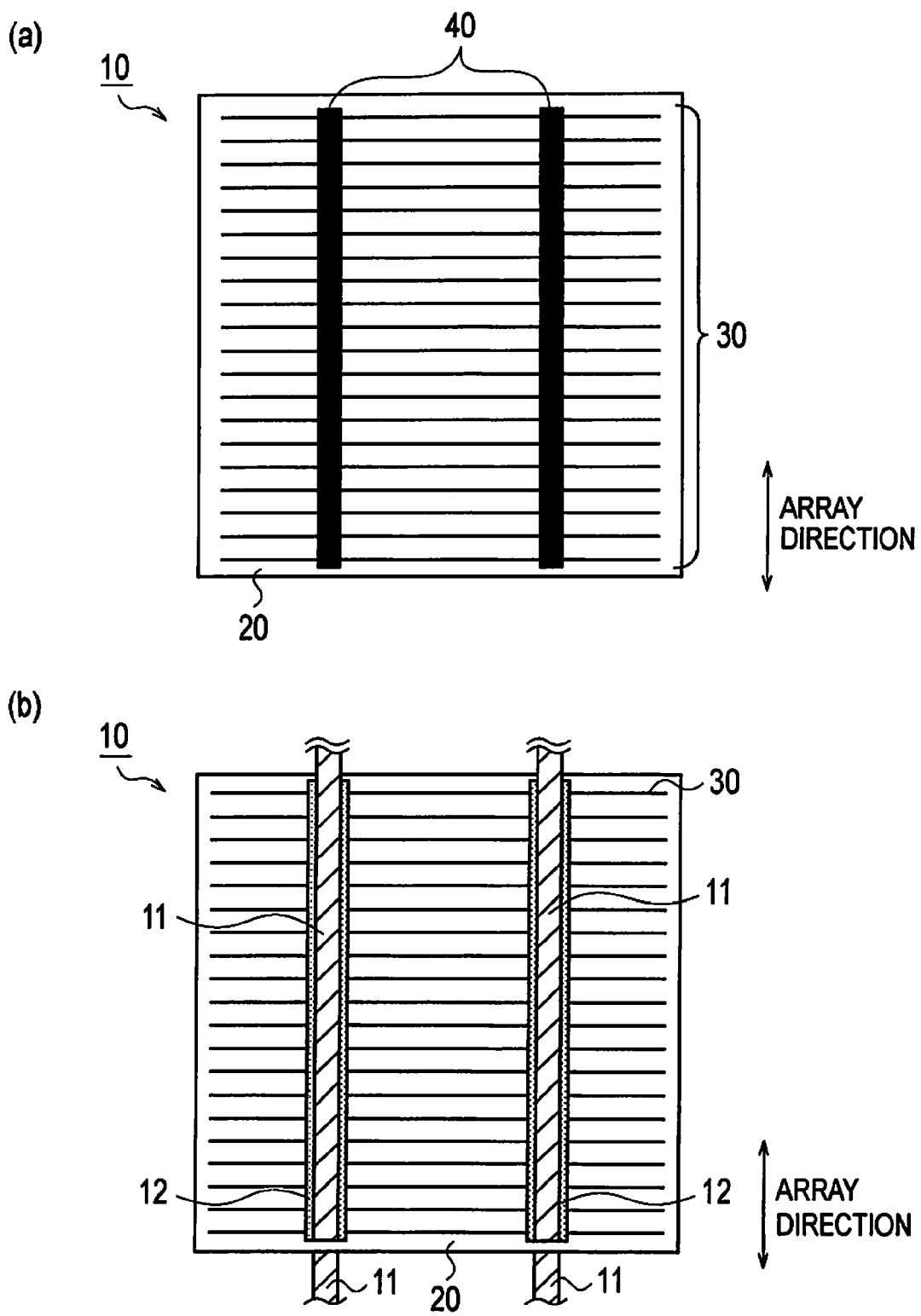
FIG. 2 shows plan views of a solar cell 10 according to the embodiment of the present invention.

Next, a configuration of the solar cell 10 will be described with reference to FIG. 2. FIG. 2(*a*) is a plan view of the solar cell 10 according to this embodiment. FIG. 2(*b*) shows a state where the wiring members 11 are bonded to the solar cell 10 with the resin adhesive 12 therebetween.

As shown in FIG. 2(a), the solar cell 10 includes a photoelectric converter 20, thin wire electrodes 30, and connection electrodes 40.

The photoelectric converter 20 generates photo-generated carriers when the light receiving surface receives solar light. The photo-generated carriers are holes and electrons generated when the photoelectric converter 20 absorbs solar light. The photoelectric converter 20 includes an n-type region and a p-type region therein, and a semiconductor junction is formed at an interface between the n-type region and the p-type region. The photoelectric converter 20 can be formed using a semiconductor substrate composed of: a crystalline semiconductor material, such as a monocrystalline Si or a polycrystalline Si; a compound semiconductor material, such as GaAs or InP; or the like. Meanwhile, the photoelectric converter 20 may have a so-called HIT structure. In the HIT structure, a substantially intrinsic amorphous silicon layer is sandwiched between a monocrystalline silicon substrate and an amorphous silicon layer to reduce defects at an interface therebetween and to thus improve characteristics of a heterojunction at the interface.

The thin wire electrodes 30 are electrodes to collect photo-generated carriers from the photoelectric converter 20. As shown in FIG. 2(a), the thin wire electrodes 30 are formed linearly in a direction approximately orthogonal to the array direction. The multiple thin wire electrodes 30 are formed almost all over the region on the photoelectric converter 20. The thin wire electrodes 30 can be each formed using a resin conductive paste containing a resin material as its binder and conductive particles, such as silver particles, as its filler.

As shown in FIG. 1, the thin wire electrodes 30 are formed similarly on both the light receiving surface and the back surface. Meanwhile, the thin wire electrodes 30 formed on the back surface of the photoelectric converter 20 may be formed to entirely cover the back surface of the photoelectric converter 20.

The connection electrodes 40 are electrodes to which the wiring members 11 are respectively connected. The connection electrodes 40 collect photo-generated carriers from the multiple thin wire electrodes 30. As shown in FIG. 2(a), the connection electrodes 40 are formed linearly in the array direction so as to intersect with the thin wire electrodes 30. The connection electrodes 40 can be formed using a resin conductive paste containing a resin material as its binder and conductive particles, such as silver particles, as its filler.

As shown in FIG. 1, the connection electrodes 40 are formed similarly on both the light receiving surface and the back surface. Each of the solar cells 10 according to this embodiment includes two connection electrodes 40. The multiple thin wire electrodes 30 and the connection electrodes 40 are formed in a grid pattern on the light receiving surface and the back surface of the photoelectric converter 20. Meanwhile, the number of the connection electrodes 40 can be appropriately set in consideration of the size of the photoelectric converter 20.

Here, as shown in FIG. 2(b), the resin adhesive 12 is disposed on the connection electrodes 40 so as to extend in the array direction. The wiring member 11 is disposed on the resin adhesive 12 so as to extend in the array direction. Accordingly, the connection electrodes 40, the resin adhesive 12, and the wiring members 11 are sequentially stacked on the photoelectric converter 20.

Note that the width of the strip-shaped adhesive 12 may be approximately the same as the width of the connection electrode 40 or smaller than the width of the connection electrode 40, although the width of the adhesive 12 is larger than the width of the connection electrode 40 in this embodiment.

(Method of Manufacturing Solar Cell String)

Next, a method of manufacturing the solar cell string according to this embodiment will be described by using FIGS. 3 to 6. In this embodiment, the solar cell string 1 includes n solar cells 10. Each solar cell 10 includes two connection electrodes 40 on both its light receiving surface and back surface.

(Temporary Bonding Step 1)

First, the n solar cells 10 stacked on top of one another are housed in a housing cassette (unillustrated). Next, one of the solar cells 10 is moved onto a mounting table 53. The formation pattern of the collecting electrodes (thin wire electrodes 30, connection electrodes 40) formed on the light receiving surface of the solar cell 10 is checked, and the position of the solar cell 10 on the mounting table 53 is adjusted.

Next, the aforementioned resin adhesive 12 is applied onto the connection electrode 40 formed on the light receiving surface of the solar cell 10, and then is crimped on the connection electrode 40 formed on the light receiving surface of the solar cell 10 by using a first tool 56. In this event, if the first tool 56 is preheated, the resin adhesive 12 can be smoothly applied onto the connection electrode 40. In this way, the resin adhesive 12 is applied onto the connection electrode 40 formed on the light receiving surface of the solar cell 10.

Such application of the resin adhesive 12 can be performed simultaneously on the two connection electrodes 40.

The above steps are repeated for each of the n solar cells 10.

(Temporary Bonding Step 2)

First, wiring members 11 are prepared which have lengths approximately twice as long as the length of the main surface of the solar cell 10 in the array direction.

Figure 4:
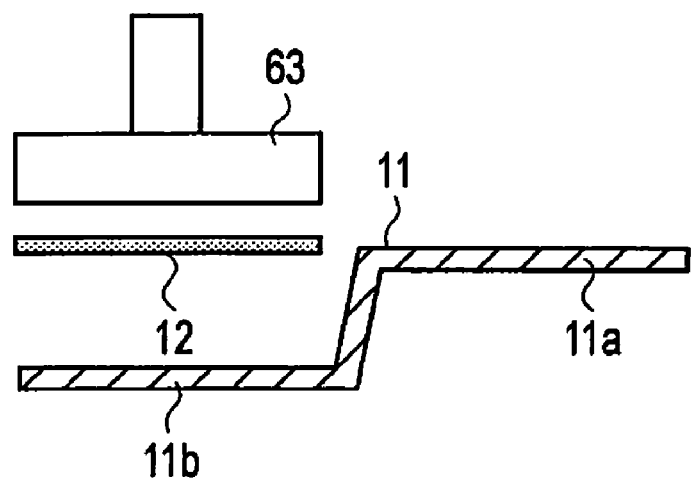
FIG. 4 is a diagram for explaining the method of manufacturing the solar cell string 1 according to the embodiment of the present invention (temporary bonding step 2).

Next, as shown in FIG. 4, a step in a thickness direction of the wiring member 11 is formed near the center of the wiring member 11. Forming such a step allows the wiring member 11 to have distinct portions: a first portion 11a that is to be disposed on the light receiving surface of one solar cell 10 and a second portion 11b that is to be disposed on the back surface of another solar cell 10. Note that the height of the step can be appropriately set according to the thickness of the solar cell 10.

Next, the aforementioned resin adhesive 12 is crimped on the second portion 11b by using a second tool 63. In this event, if the second tool 63 is preheated, the resin adhesive 12 can be smoothly crimped on the second portion 11b.

In this way, the resin adhesive 12 is applied to the wiring member 11. Such steps are repeated 2(n+1) times.

(Temporary Bonding Step 3)

Next, the first portions 11a of one pair of the wiring members 11 are disposed respectively on the connection electrodes 40 formed on the light receiving surface of one solar cell 10, with the resin adhesive 12 sandwiched therebetween. Further, the connection electrodes 40 formed on the back surface of the one solar cell 10 are disposed respectively on the second portions 11b of another pair of the wiring members 11, with the resin adhesive 12 sandwiched therebetween (step A).

Figure 5:
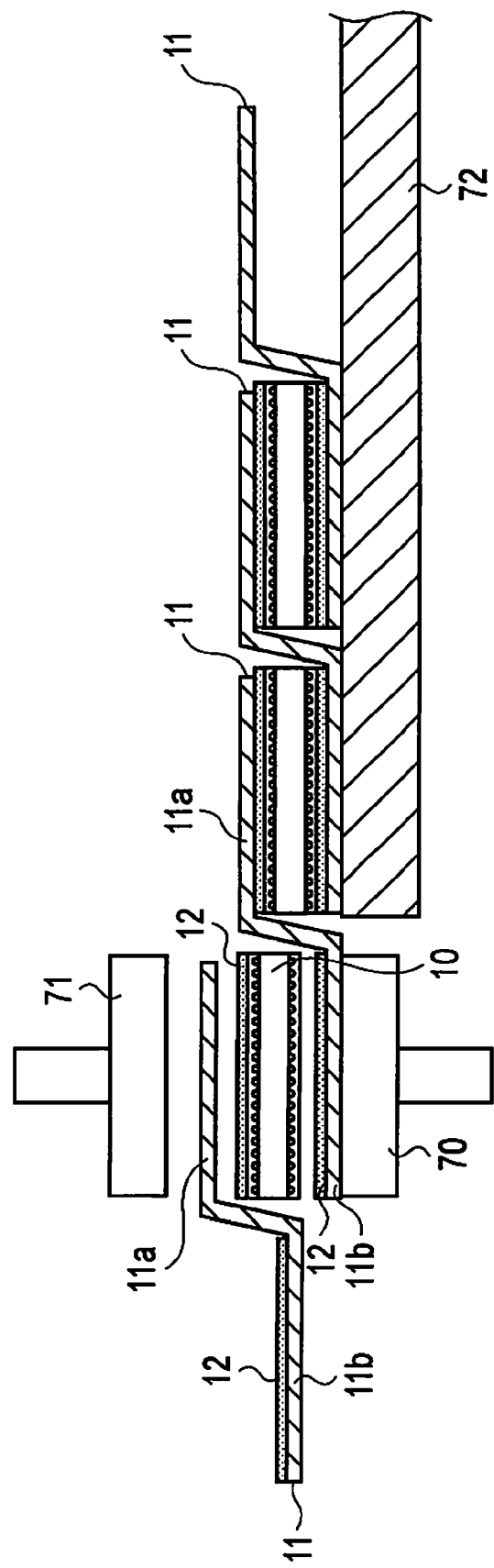
FIG. 5 is a diagram for explaining the method of manufacturing the solar cell string 1 according to the embodiment of the present invention (temporary bonding step 3).

Specifically, first, on a third tool 70 shown in FIG. 5, the second portions 11b of two wiring members 11 are disposed with their resin adhesive 12 up.

Next, a solar cell 10 is disposed on the second portions 11b of the two wiring members 11.

Next, the first portions 11a of other two wiring members 11 are disposed respectively on two connection electrodes 40 formed on the light receiving surface of the solar cell 10. Accordingly, a stacked body obtained by sequentially stacking the wiring member 11, the resin adhesive 12, the solar cell 10, the resin adhesive 12, and the wiring member 11 is formed on the third tool 70.

Next, using a fourth tool 71, the stacked body is pressed from above the stacked body for 1 to 3 seconds with 1 to 2 MPa. In this event, by preheating the fourth tool 71 up to approximately 70 to 110° C., the resin adhesive 12 is heated at a temperature equal to or higher than the softening temperature of the resin adhesive 12 (approximately 50 to 90° C.), but lower than the hardening temperature thereof (step B). This allows the pairs of the two wiring members 11 to be temporarily bonded to the light receiving surface and the back surface of the solar cell 10, respectively.

While the solar cell 10 with the wiring members 11 temporarily bonded thereto is being moved onto a mounting table 72, the above steps are repeated n times (step C). Consequently, formed is a temporarily-bonded solar cell string 1 which includes the n solar cells 10 and the 2(n+1) wiring members 11.

(Main Crimping Step)

Next, the temporarily-bonded solar cell string 1 is moved to a main crimping stage, where the solar cells 10 and the wiring members 11 are subjected to main crimping. In this embodiment, "main crimping" refers to hardening of the resin adhesive 12 to bond the solar cells 10 and the wiring members 11 together.

Figure 6:
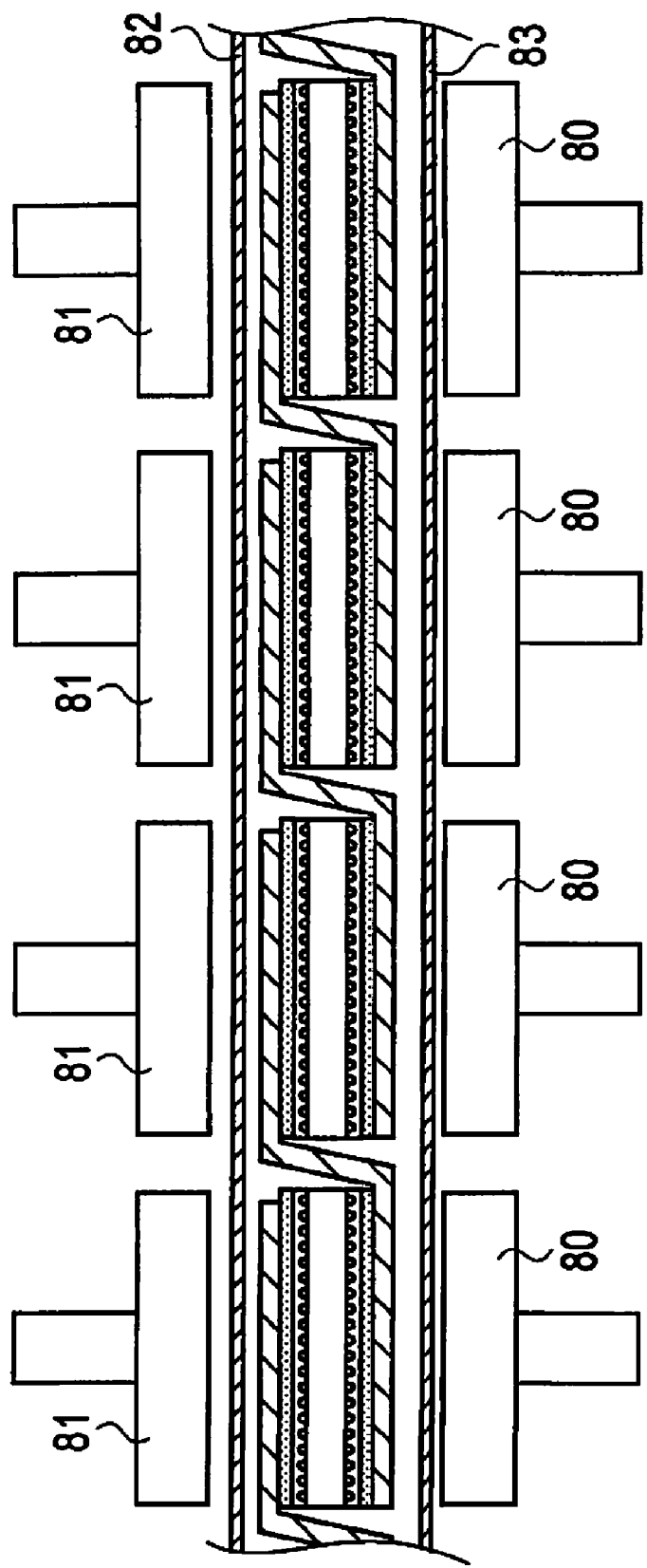
FIG. 6 is a diagram for explaining the method of manufacturing the solar cell string 1 according to the embodiment of the present invention (main bonding step).

As shown in FIG. 6, in the main crimping stage, n vertical pairs of a fifth tool 80 and a sixth tool 81 are lined up, and the temporarily-bonded solar cell string 1 is disposed between each of the n pairs of the fifth tool 80 and the sixth tool 81. A sheet 82 made of Teflon (registered trademark) providing a releasing effect is disposed between the fifth tools 80 and the temporarily-bonded solar cell string 1, and a sheet 83 made of Teflon (registered trademark) is disposed between the sixth tools 81 and the temporarily-bonded solar cell string 1.

Next, using the n pairs of the fifth tool 80 and the sixth tool 81, the temporarily-bonded solar cell string 1 is pressed vertically for 15 to 20 seconds with 2 to 3 MPa. In other words, each of the wiring members 11 is pressed against the resin adhesive 12. In this event, by preheating the n pairs of the fifth tool 80 and the sixth tool 81 up to approximately 150 to 210° C., the resin adhesive 12 is heated at a temperature equal to or more than the hardening temperature thereof (approximately 130 to 180° C.) (step D). This hardens the resin adhesive 12 completely, and thus bonds the wiring members 11 to the solar cells 10.

(Method of Manufacturing Solar Cell Module)

Next, a method of manufacturing the solar cell module 100 including the solar cell string 1 will be described.

First, a stacked body is obtained by stacking an EVA (sealing material 4) sheet, the solar cell string 1, an EVA (sealing material 4) sheet, and a PET sheet (back-surface-side protection member 3) sequentially on a glass substrate (light receiving side protection member 2). Subsequently, the stacked body is subjected to heat-crimping to harden the EVA.

A terminal box, an Al frame, and the like can be attached to the solar cell module 100 manufactured in this manner.

(Advantageous Effect)

With the solar cell module manufacturing method according to this embodiment, the resin adhesive 12 is completely hardened by collectively subjecting the n solar cells 10 to heat-crimping, after the wiring members 11 are temporarily bonded to the light receiving surface and the back surface of each of the n solar cells 10.

This enables a shorter manufacturing time than a case where the heat-crimping of the wiring members 11 using the resin adhesive 12 is repeated for each of the n solar cells 10.

Specifically, the temporary bonding of the wiring members 11 is performed for each of the n solar cells 10 in the temporary bonding step 3. Accordingly, the hardening of the resin adhesive 12 can be performed collectively for all the n solar cells 10 in the main crimping step. As a result, the solar cell string 1 can be manufactured in a shorter time.

Further, because the solar cells 10 and the wiring members 11 are once bonded together temporarily, the wiring members 11 are prevented from being misaligned from the respective connection electrodes 40 in the main crimping step. As a result, stresses acting on the wiring members 11 can be prevented from being concentrated in certain portions of the corresponding solar cells 10 in the main crimping step, hence preventing breakage of the solar cells 10.

In addition, with the method of manufacturing the solar cell string 1 according to this embodiment, in the temporary bonding step 1, the resin adhesive 12 is applied onto the wiring members 11 to be disposed on the back surface of each solar cell 10, and in the temporary bonding step 2, the resin adhesive 12 is applied onto the light receiving surface of each solar cell 10.

Accordingly, in the temporary bonding step 3, it is possible to easily check whether the temporary bonding of the wiring members 11 on the light receiving surface and the back surface of each solar cell 10 has been accurately performed.

2. Second Embodiment

Next, a second embodiment of the present invention will be described with reference to FIGS. 7 and 8. This embodiment is different from the first embodiment in that the resin adhesive 12 is applied only onto the wiring members 11. For this reason, the temporary bonding step 1 is not performed. Instead, the temporary bonding step 2 is repeated twice on every wiring member 11.

Figure 7:
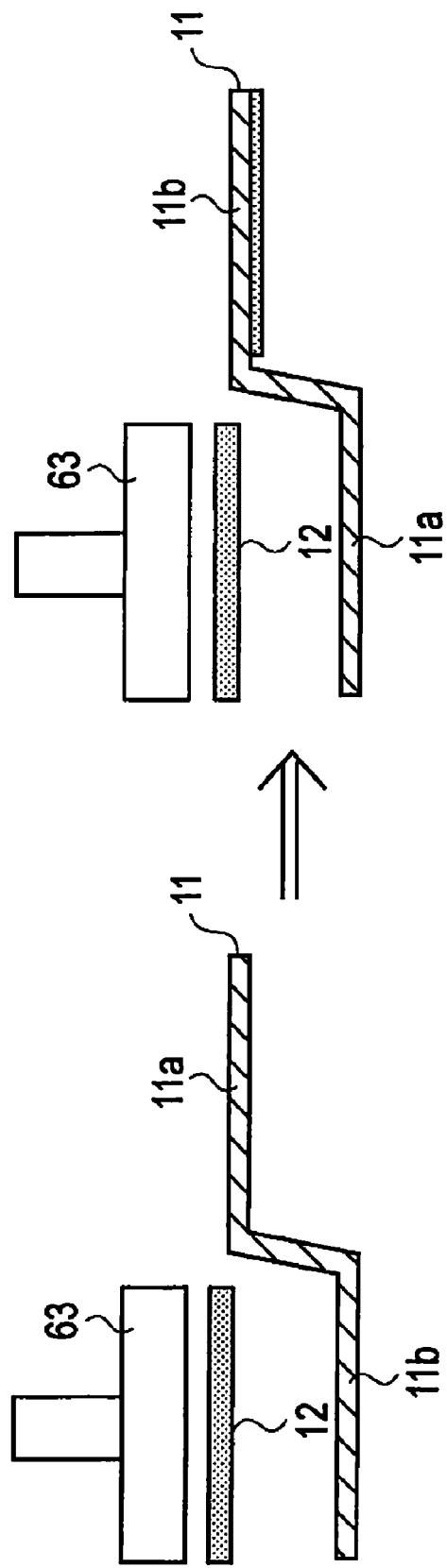
FIG. 7 is a diagram for explaining a method of manufacturing a solar cell string 1 according to an embodiment of the present invention (temporary bonding step 2).

First, as shown in FIG. 7, a wiring member 11 having undergone the temporary bonding step 2 is turned over and disposed.

Next, the resin adhesive 12 is crimped on the first portion 11a of the wiring member 11 by using the second tool 63. In this event, if the second tool 63 is preheated, the resin adhesive 12 can be smoothly applied onto the wiring member 11.

In this way, the resin adhesive 12 is applied onto both the first portion 11a and the second portion 11b of the wiring member 11. Such steps are repeated 2(n+1) times.

Figure 8:
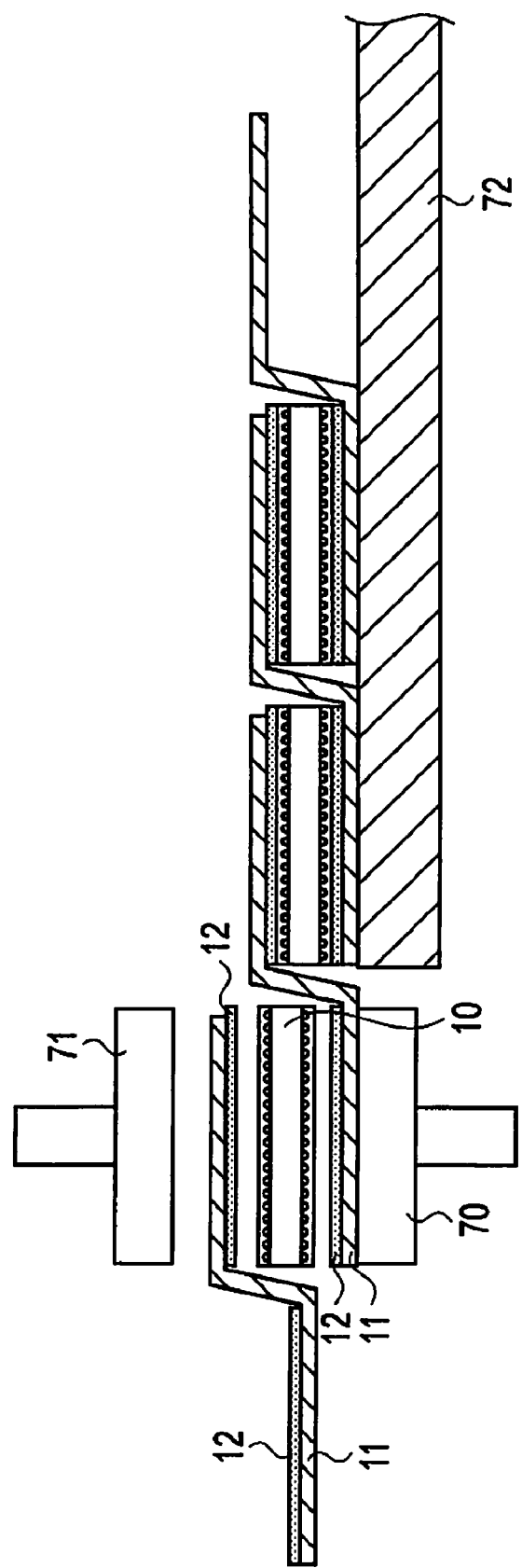
FIG. 8 is a diagram for explaining the method of manufacturing the solar cell string 1 according to the embodiment of the present invention (temporary bonding step 3).

Next, as shown in FIG. 8, the wiring members 11 are disposed on the light receiving surface and the back surface of each solar cell 10. No resin adhesive 12 is applied onto either the light receiving surface or the back surface of the solar cell 10. Thus, this step is the same as the temporary bonding step 3, except that the resin adhesive 12 is applied onto the wiring members 11.

Thereafter, a solar cell string 1 is fabricated by performing the main bonding step.

With the method of manufacturing the solar cell string according to this embodiment, the resin adhesive 12 does not need to be crimped on the solar cells 10.

As a result, it is possible to prevent breakage of the solar cells 10 which would otherwise occur at the time of bonding the resin adhesive 12 to the solar cells 10. Such breakage of the solar cells 10 is more likely to occur when the solar cells are thin. Accordingly, the method of manufacturing the solar cell string 1 according to this embodiment allows a solar cell string having thin solar cells to be manufactured without lowering the yield.

3. Third Embodiment

Next, a third embodiment of the present invention will be described with reference to FIGS. 9 and 10. This embodiment is different from the first embodiment in that the resin adhesive 12 is temporarily bonded to the connection electrodes 40 formed on the light receiving surface and the back surface of each solar cell 10. For this reason, the temporary bonding step 2 is not performed. Instead, the temporary bonding step 1 is performed additionally on the back surface of the solar cell 10.

First, a solar cell 10 having undergone the temporary bonding step 1 is turned over and disposed on the mounting table 53 with its back surface up.

Next, the formation pattern of the collecting electrodes (thin wire electrodes 30, connection electrodes 40) formed on the light receiving surface of the solar cell 10 is checked, and the position of the solar cell 10 on the mounting table 53 is adjusted.

Figure 9:
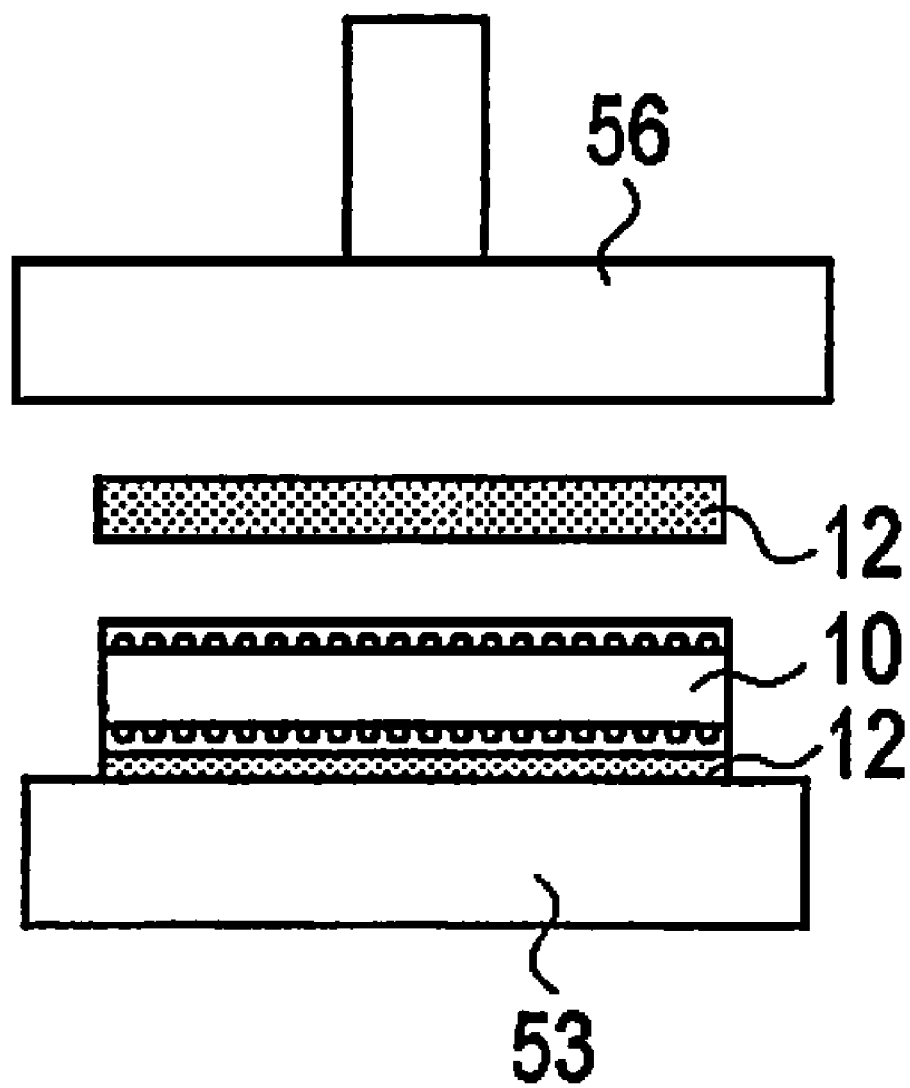
FIG. 9 is a diagram for explaining a method of manufacturing a solar cell string 1 according to an embodiment of the present invention (temporary bonding step 1).

Next, as shown in FIG. 9, the resin adhesive 12 is disposed on the connection electrode formed on the back surface of the solar cell 10, and then crimped on the connection electrode 40 using the first tool 56. In this event, if the first tool 56 is preheated, the resin adhesive 12 can be smoothly applied onto the connection electrode. Such application of the resin adhesive 12 can be performed simultaneously on the two connection electrodes 40.

The above steps are repeated for each of the n solar cells 10.

Figure 10:
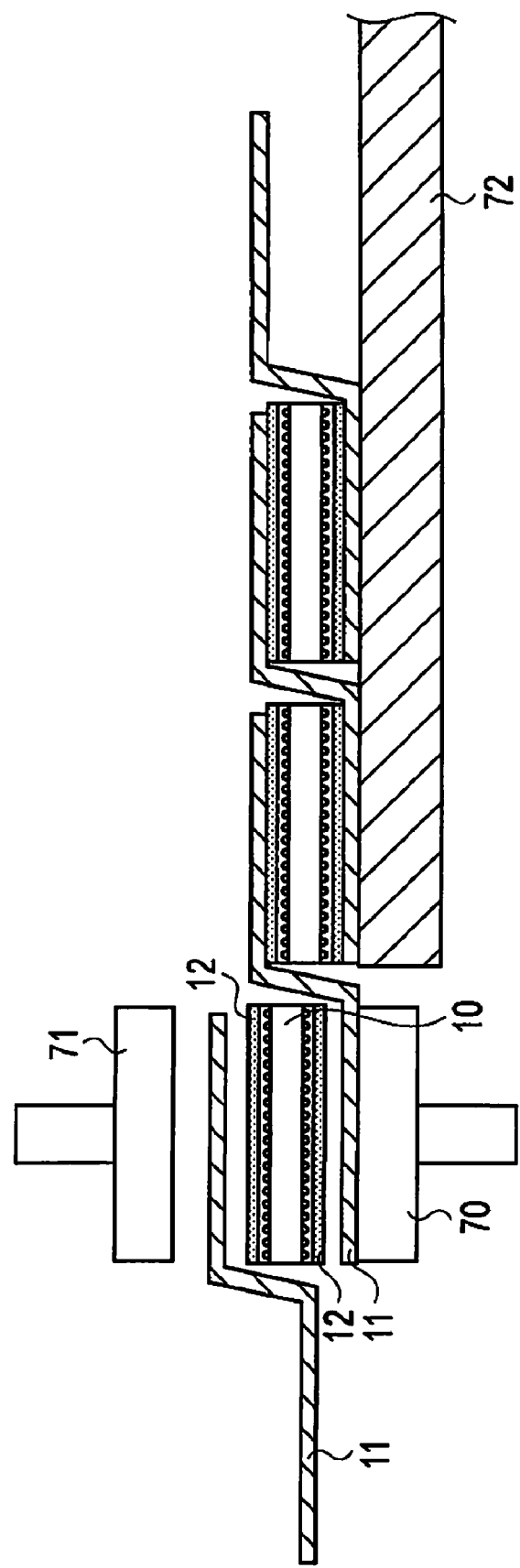
FIG. 10 is a diagram for explaining the method of manufacturing the solar cell string 1 according to the embodiment of the present invention (temporary bonding step 3).

Next, as shown in FIG. 10, the wiring members 11 are temporarily bonded to the light receiving surface and the back surface of each solar cell 10. The resin adhesive 12 is already applied onto the light receiving surface and the back surface of the solar cell 10. Thus, this step is the same as the temporary bonding step 3, except that no resin adhesive 12 is applied to the wiring members 11.

Thereafter, a solar cell string 1 is fabricated by performing the main bonding step.

4. Fourth Embodiment

Figure 11:
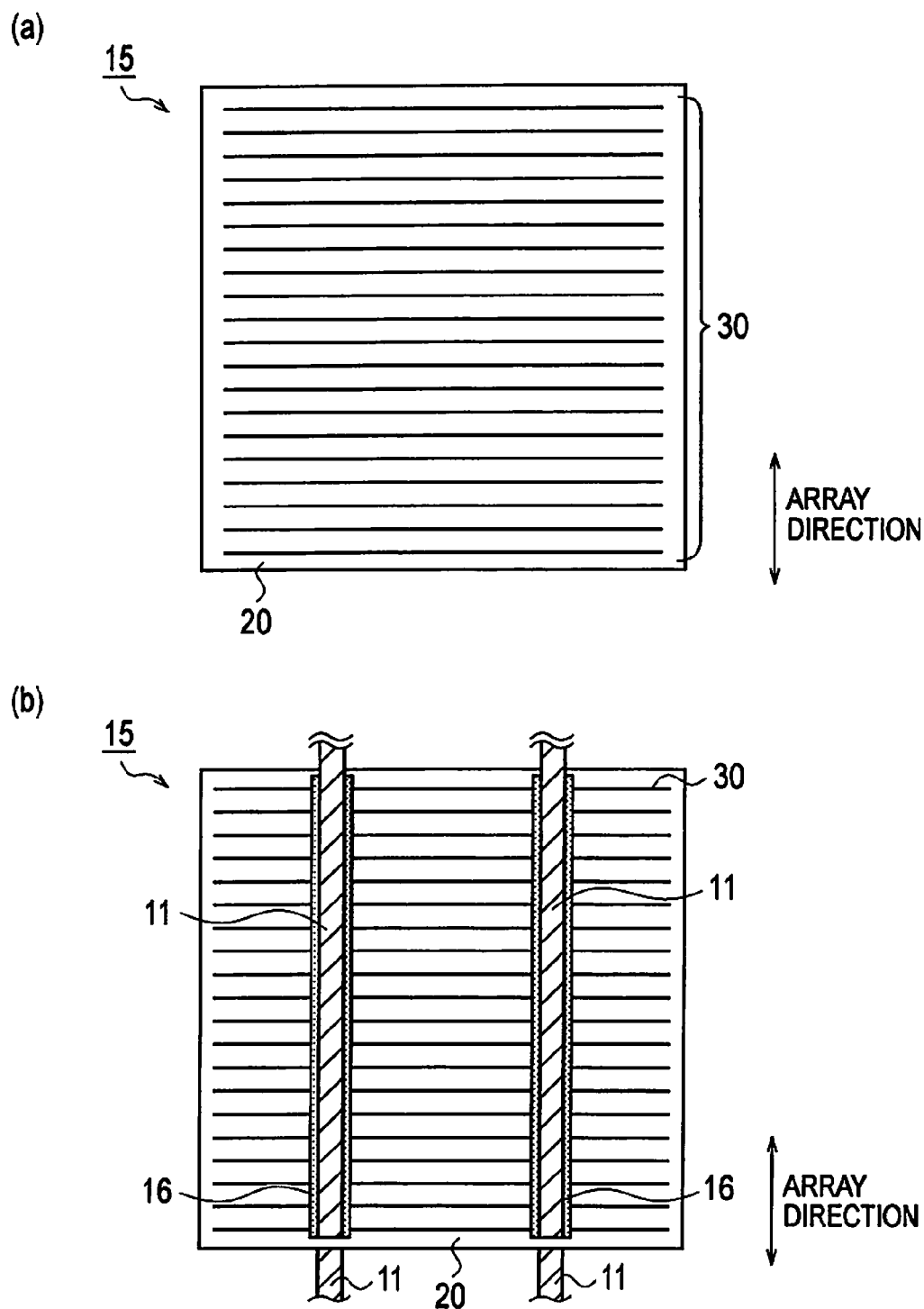
FIG. 11 shows plan views of a solar cell 15 according to an embodiment of the present invention.

Next, a fourth embodiment of the present invention will be described with reference to FIG. 11. FIG. 11(a) is a plan view of a solar cell 15 according to this embodiment. FIG. 11(b) shows a state where the wiring members 11 are bonded to the solar cell 15 with resin adhesive 16 therebetween.

As shown in FIG. 11(a), the solar cell 15 according to this embodiment is different from the solar cell 10 according to the first embodiment in that no connection electrodes 40 are formed either on the light receiving surface or the back surface. In addition, the resin adhesive 16 according to this embodiment is different from the resin adhesive 12 according to the first embodiment in that the resin adhesive 16 contains no conductive particles. Besides these differences, this embodiment is the same as the first embodiment.

Since the connection electrodes 40 are formed on neither the light receiving surface nor the back surface, a method of manufacturing a solar cell string according to this embodiment does not require adjustment of the position of the solar cell 15 in the temporary bonding step 1, and adjustment of the positions of the wiring members 11 in the temporary bonding step 3.

Moreover, since the solar cell 15 includes no connection electrodes 40, part of each thin wire electrode 30 is buried in each wiring member 11 in the main bonding step. Accordingly, conduction between the thin wire electrodes 30 and the wiring members 11 can be secured directly, and thus the resin adhesive 16 does not need to contain the conductive particles.

5. Fifth Embodiment

Next, a fifth embodiment of the present invention will be described with reference to the drawings. Differences between the aforementioned first embodiment and the fifth embodiment will be mainly described below.

Specifically, in the fifth embodiment, each wiring member 11 is connected to the light receiving surfaces of a pair of adjacent solar cells 10, or to the back surfaces of a pair of adjacent solar cells 10. For this reason, each wiring member 11 is formed linearly, instead of being bent in a gap between the pair of solar cells 10.

(Configuration of a Solar Cell String)

Figure 12:
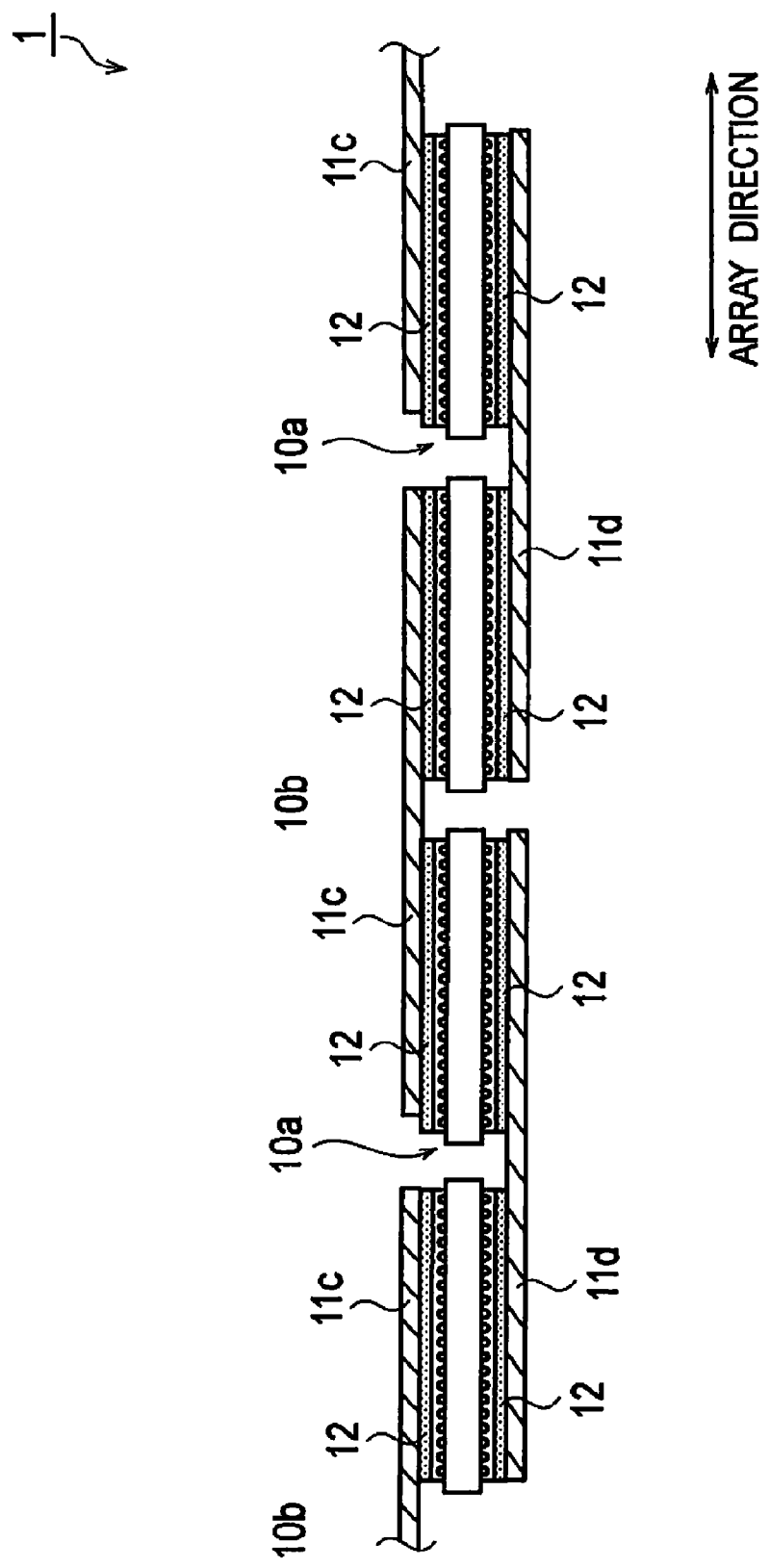
FIG. 12 is a side view of a solar cell string 1 according to an embodiment of the present invention.

FIG. 12 is a side view of a solar cell string according to the fifth embodiment. As shown in FIG. 12, the light receiving surface of a solar cell 10a and the light receiving surface of an adjacent solar cell 10b are connected by wiring members 11c. In addition, the back surface of the solar cell 10a and the back surface of another adjacent solar cell 10b are connected by wiring members 11d. In the fifth embodiment, the polarity of the light receiving surface of each solar cell 10a is different from the polarity of the light receiving surface of each solar cell 10b, and thus each solar cell 10a is electrically connected in series to the corresponding solar cells 10b respectively by the wiring members 11c and the wiring members 11d.

(Manufacturing Method of Solar Cell String)

Next, a method of manufacturing the solar cell string according to the fifth embodiment will be described by using FIGS. 13 and 14. Note that the fifth embodiment is different from the first embodiment in the temporary bonding step 2 and the temporary bonding step 3.

(Temporary Bonding Step 1)

Figure 3:
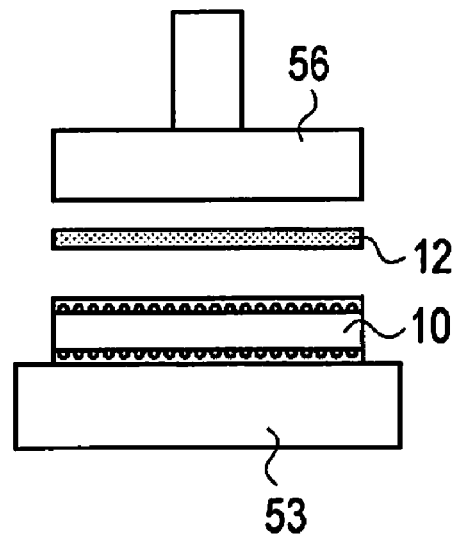
FIG. 3 is a diagram for explaining a method of manufacturing a solar cell string 1 according to the embodiment of the present invention (temporary bonding step 1).

First, resin adhesive 12 is disposed on the connection electrodes 40 formed on the light receiving surface of a solar cell 10, and then crimped on the connection electrodes 40 by using the first tool 56 (see FIG. 3). Such a temporary bonding step 1 is performed for each solar cell 10a and each solar cell 10b.

(Temporary Bonding Step 2)

Figure 13:
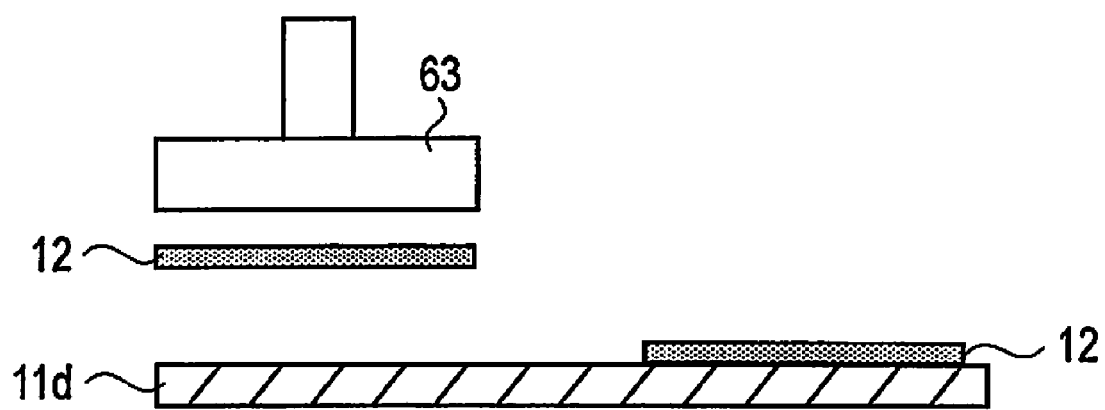
FIG. 13 is a diagram for explaining a method of manufacturing the solar cell string 1 according to the embodiment of the present invention (temporary bonding step 2).

Next, as shown in FIG. 13, resin adhesive 12 is crimped on the wiring members 11d to be connected to the back surface of the solar cell 10a and the back surface of the solar cell 10b. Specifically, the resin adhesive 12 is applied onto portions of each wiring member 11d which are to be connected to the connection electrodes 40 formed on the back surface of the solar cell 10a and the back surface of the solar cell 10b, respectively.

(Temporary Bonding Step 3)

Next, the solar cell 10a and the solar cell 10b are disposed on the wiring members 11d, and further, the wiring members 11c are disposed on the solar cell 10a and another adjacent solar cell 10b (step A).

Figure 14:
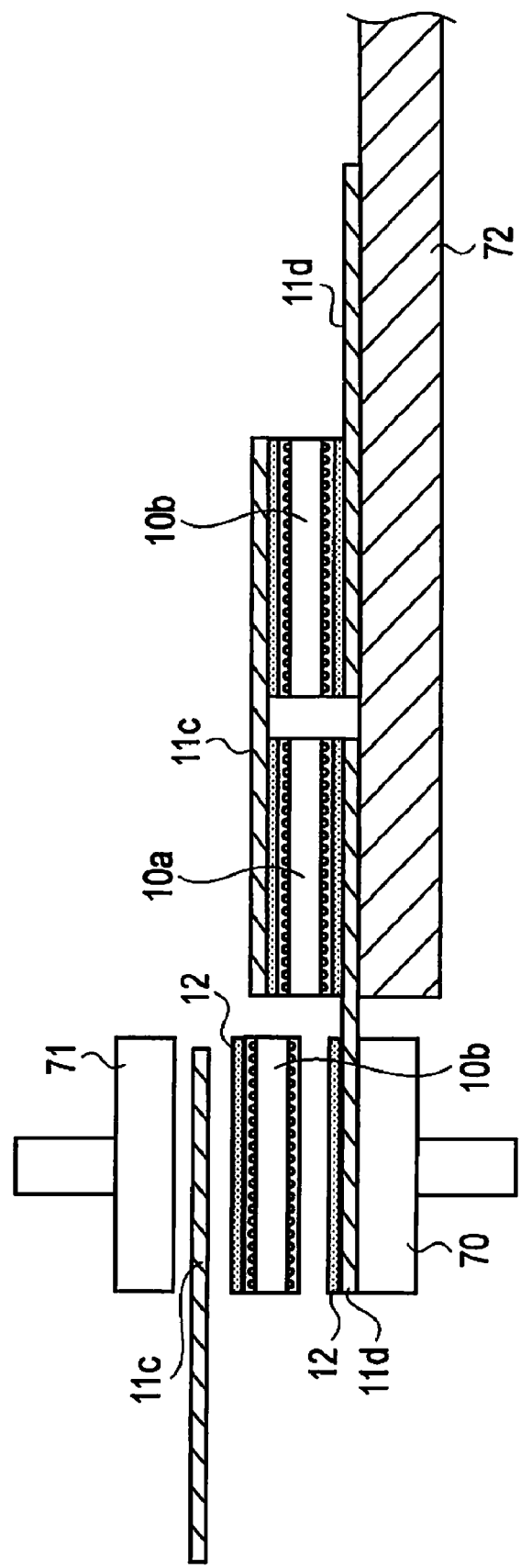
FIG. 14 is a diagram for explaining the method of manufacturing the solar cell string 1 according to the embodiment of the present invention (temporary bonding step 3).

Specifically, as shown in FIG. 14, the wiring members 11d, the solar cell 10a or the solar cell 10b, and the wiring members 11c are sequentially disposed on the third tool 70.

Next, using the fourth tool 71, a pressure of 1 to 2 MPa is applied from above the wiring members 11c for 1 to 3 seconds. In this event, by preheating the fourth tool 71 up to approximately 70 to 110° C., the resin adhesive 12 is heated at a temperature equal to or higher than the softening temperature of the resin adhesive 12 (approximately 50 to 90° C.), but lower than the hardening temperature thereof (step B).

While the solar cell 10a or the solar cell 10b with the wiring members 11c and the wiring members 11d temporarily bonded thereto is being moved onto the mounting table 72, the above steps are repeated (step C). Consequently, a temporarily-bonded solar cell string is formed.

(Main Bonding Step)

Next, the temporarily-bonded solar cell string is moved to the main bonding stage, where the temporarily-bonded solar cell string is vertically pressed for 15 to 20 seconds with 2 to 3 MPa. Consequently, the resin adhesive 12 is hardened.

Other Embodiments

Although the present invention has been described based on the above embodiments, it should not be understood that the descriptions and the drawings constituting part of this disclosure limit this invention. Various alternative embodiments, examples, and operation techniques will become apparent to those skilled in the art from this disclosure.

For example, in the above embodiments, the thin wire electrodes 30 are formed on the light receiving surface and the back surface of each solar cell so as to extend in the direction approximately orthogonal to the array direction. However, the thin wire electrodes 30 may be formed in a direction inclined relative to the array direction.

Figure 15:
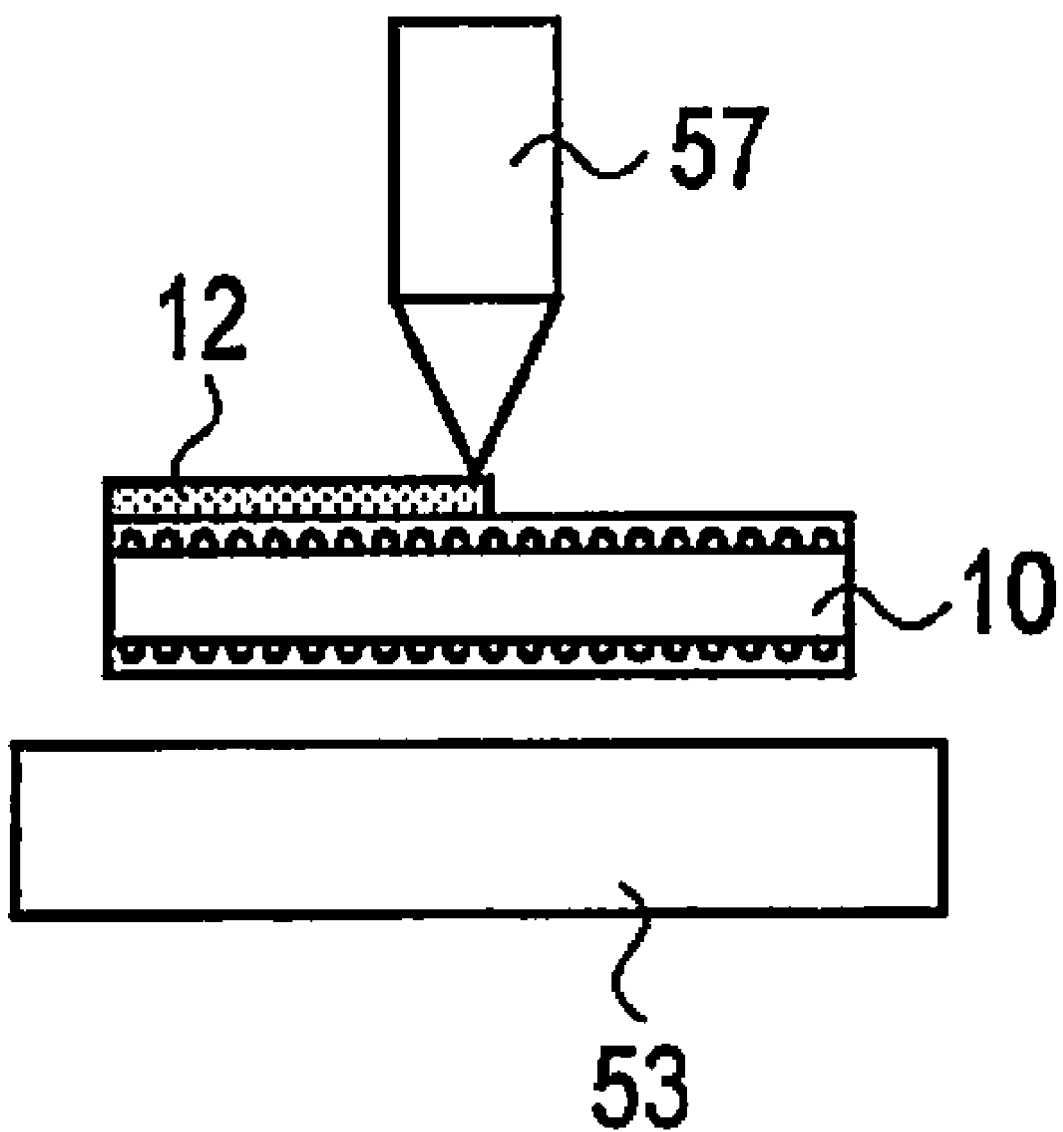
FIG. 15 is a diagram for explaining a method of manufacturing a solar cell string 1 according to an embodiment of the present invention (temporary bonding step 1).

Moreover, although a strip-shaped film adhesive is used as the resin adhesive 12 in the above embodiments, resin adhesive 12 in liquid form may be applied by a dispenser 57, as shown in FIG. 15.

Furthermore, although n sets of the fifth tool 80 and the sixth tool 81 are disposed in the above embodiments, the number of sets of the fifth tool 80 and the sixth tool 81 can be set to any number in consideration of the capital equipment expenditure.

As described above, the present invention naturally includes various embodiments that are not described herein. Therefore, the technical scope of the present invention shall be determined solely by claimed elements according to the scope of claims reasonably understood from the above description.

It is to be noted that the entire contents of Japanese Patent Application No. 2007-184962 (filed on Jul. 13, 2007) are incorporated herein by reference.

INDUSTRIAL APPLICABILITY

As described above, the present invention can provide a solar cell string manufacturing method enabling a shorter manufacturing time, and therefore is advantageous in the field of photovoltaic power generation.

The invention claimed is:

1. A method of manufacturing a solar cell module including a solar cell string between a light-receiving-surface-side protection material and a back-surface-side protection material, the solar cell string being formed of a plurality of solar cells and wiring members electrically connecting the plurality of solar cells to one another, the plurality of solar cells each having a light receiving surface from which light enters, and a back surface provided on a side opposite to the light receiving surface, the method comprising:

a step A of
disposing one of the wiring members on the light receiving surface of one solar cell of the plurality of solar cells, with a thermosetting resin adhesive interposed therebetween, the wiring member being to be connected to a solar cell adjacently located on one side of the one solar cell, and disposing another one of the wiring members on the back surface of the one solar cell with the resin adhesive interposed therebetween, the wiring member being to be connected to a solar cell adjacently located on the other side of the one solar cell;

a step B of bonding the wiring members to the one solar cell by heating the resin adhesive at a temperature higher than a softening temperature of the resin adhesive but lower than a hardening temperature of the resin adhesive;

a step C of bonding the wiring members to all the plurality of solar cells by repeating the step A and the step B alternately; and a step D of hardening the resin adhesive by heating the resin adhesive at a temperature equal to or higher than the hardening temperature of the resin adhesive with the resin adhesive being pressed against the wiring members.

2. The method of manufacturing a solar cell module according to claim 1, wherein
in the step A, the resin adhesive is applied onto a part of the wiring member, the part being to be disposed on the back surface of the one solar cell, and onto the light receiving surface of the one solar cell.

3. The method of manufacturing a solar cell module according to claim 1, wherein
in the step A, the resin adhesive is applied onto a part of the wiring member, the part being to be disposed on the back surface of the one solar cell, and onto a part of the wiring member, the part being to be disposed on the light receiving surface of the one solar cell.

4. The method of manufacturing a solar cell module according to claim 1, wherein
in the step A, the resin adhesive is applied onto the back surface of the one solar cell and onto a part of the wiring member, the part being to be disposed on the light receiving surface of the one solar cell.

5. The method of manufacturing a solar cell module according to claim 1, wherein
a plurality of thin wire electrodes are formed on the light receiving surface and the back surface of each of the plurality of solar cells, and
in the step D, a part of each of the thin wire electrodes is buried in the corresponding wiring member by pressing the wiring member against the resin adhesive.

* * * * *